United States Patent [19]

Kuyel

[11] Patent Number: 4,496,425
[45] Date of Patent: Jan. 29, 1985

[54] TECHNIQUE FOR DETERMINING THE END POINT OF AN ETCHING PROCESS

[75] Inventor: Birol Kuyel, Hopewell Township, Mercer County, N.J.

[73] Assignee: AT&T Technologies, Inc., New York, N.Y.

[21] Appl. No.: 575,378

[22] Filed: Jan. 30, 1984

[51] Int. Cl.³ .............................. C23F 1/02; B44C 1/22; C03C 15/00; C03C 25/06
[52] U.S. Cl. .................................. 156/626; 156/643; 156/656; 156/665; 204/192 E; 356/445
[58] Field of Search ............... 156/626, 627, 643, 646, 156/656, 665, 345; 204/164, 192 E, 298; 356/445, 448

[56] References Cited

U.S. PATENT DOCUMENTS

| | | | |
|---|---|---|---|
| 3,945,825 | 3/1976 | Gale et al. ................... | 156/659.1 X |
| 4,039,370 | 8/1977 | Kleinknecht ................... | 156/626 |
| 4,179,622 | 12/1979 | Moritz ........................... | 156/626 X |
| 4,198,261 | 4/1980 | Basta et al. ................... | 156/626 |
| 4,317,698 | 3/1982 | Christol et al. ................ | 156/626 |
| 4,444,618 | 4/1984 | Saia et al. ..................... | 156/643 |
| 4,454,001 | 6/1984 | Sternheim ..................... | 156/626 |

FOREIGN PATENT DOCUMENTS 56-50515  5/1981  Japan ................................... 156/626

OTHER PUBLICATIONS

Jenkins et al., *Fundamentals of Optics*, McGraw-Hill Book Co., 1957, Chapter 18, "Fresnel Diffraction", pp. 353–363.

*Primary Examiner*—William A. Powell
*Attorney, Agent, or Firm*—D. J. Kirk

[57] ABSTRACT

A method for detecting the end point of the plasma etching of a pattern (36) in an aluminum layer (33) on a silicon wafer (16). The pattern (36) and portions of a Fresnel zone plate (30) are simultaneously etched in the aluminum layer (33). The intensity of the light reflected from the Fresnel zone plate (30) during plasma etching is monitored and the etching process terminated when the intensity falls below a predetermined level.

14 Claims, 4 Drawing Figures

TECHNIQUE FOR DETERMINING THE END POINT OF AN ETCHING PROCESS

TECHNICAL FIELD

The instant invention relates to a technique for detecting the end point of an etching process.

BACKGROUND OF THE INVENTION

It is well known to plasma etch layers on a semiconductor substrate to fabricate electronic devices. Plasma etching is the removal of material by reaction with chemically active gases created by an RF power induced glow discharge environment in an etching chamber. As compared with wet chemical etching, it is dry, cleaner, more economical, free of volumes of waste to be disposed of and, when properly controlled, capable of sharper etching with less undercutting.

Plasma etching is controlled by a number of parameters including the nature of the etching gas, the RF power level used, the gas flow rate and chamber pressure, the temperature, and the load or volume of material to be etched. Because of the many variables, empirically setting process specifications and obtaining run-to-run reproducibility has been very difficult.

In some etching processes the selectivity and anisotropy are merely adequate; it is desirable to etch only until a pattern is defined. Over etching leads to problems such as undercutting and etching of the underlying material. Consequently, it is desirable to stop the etching process as close to the point of completion as possible.

Plasma etching chambers typically have viewing windows of optical quartz. Experienced operators are sometimes able to detect a color intensity change of the plasma during the etching process as the products generated often change when etching is complete, indicating that an end point has been reached and exceeded. However, this kind of control is highly subjective. Another very subjective control for an experienced operator is the visual detection of the color change in a nonabsorbing film as it is etched away or, similarly, noting the disappearance of a metallic film.

One automated method for end point detection in a plasma etching process is described in U.S. Pat. No. 4,198,261 to Busta et al. That patent describes the use of an optical technique in which light is beamed on a layer to be etched and the resulting reflected and refracted beam is detected. Different values of light intensity can be detected when the desired layer is etched and the underlying layer receives the light beam. The change in light intensity may be used to trigger the end of the etching process. Unfortunately, background signals tend to mask the reflected light signal resulting in difficult or inaccurate detection of the end point.

Other end point detection methods such as spectroscopic and laser interferometric techniques are also well known. However, spectroscopy requires accurate monitoring of an atomic emission line which is difficult to accomplish in a plasma due to the variations in the emission intensity with fluctuations or drifts in the plasma parameters as well as the chemical constituents. This usually results in an end point that is not sharply defined. The laser interferometric techniques are not applicable to many critical etching steps (such as aluminum) since they rely on the interference of two lightwaves, one reflected from the top and the other from the bottom of the film to be etched. Results require even greater interpretation compared to spectroscopic techniques.

Accordingly, there is a need for an effective, accurate method of detecting the end point of a plasma etching operation.

SUMMARY OF THE INVENTION

The foregoing problems have been overcome by the instant method for detecting the end point of the etching of a pattern formed in a layer of material by etching through openings in an etch resistant coating on the surface of the material. The method comprises the steps of simultaneously etching: (1) the material, through the openings, and (2) a Fresnel zone plate, located proximate the first pattern, comprised of a plurality of annular zones which are alternatively formed of the etch resistant material and the exposed material to be etched; monitoring light reflected from the Fresnel zone plate during etching; and terminating the etch process when the intensity of the reflected light falls below a predetermined level.

Advantageously, the instant technique substantially enhances the intensity of the reflected light.

DETAILED DESCRIPTION

The instant invention is described in relation to plasma etching of aluminum from silicon wafers. However, such description is for purposes of exposition and not for limitation as other reflective materials such as $TaSi_2$, polysilicon or the like can be etched and the end point detected using the instant techniques. Additionally, the techniques described can be used to determine the end point in chemical etching methods in which light can be directed on, and reflected from, the material being etched.

Figure 1:
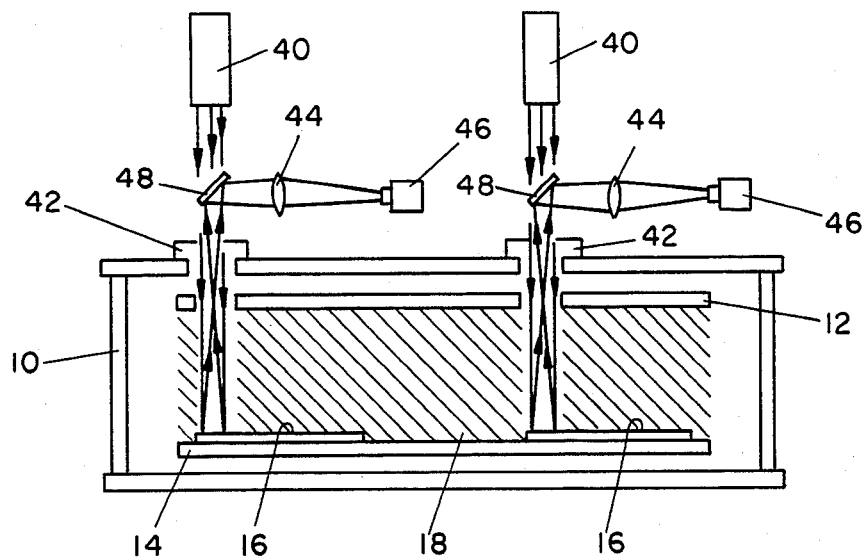
FIG. 1 is a schematic drawing of a plasma etching reactor.

FIG. 1 shows a plasma etching vacuum chamber 10 with upper and lower electrodes 12 and 14, respectively, therein. A plurality of aluminum coated silicon wafers 16—16 are shown positioned on the lower electrode 14. An apertured layer of photoresist (not shown) covers the aluminum coated layer. In operation, the pressure in the chamber 10 is lowered and chemically active gases such as $BCl_3/Cl_2$ are directed therein. An RF signal from a coil (not shown) surrounding the chamber 10 creates an induced glow discharge or plasma 18 which etches portions of the aluminum layer exposed through the apertures in the photoresist. As hereinbefore indicated, it is desirable to accurately determine when the selected portions of the aluminum layer have been completely etched with a minimum of under or over etching.

Figure 2:
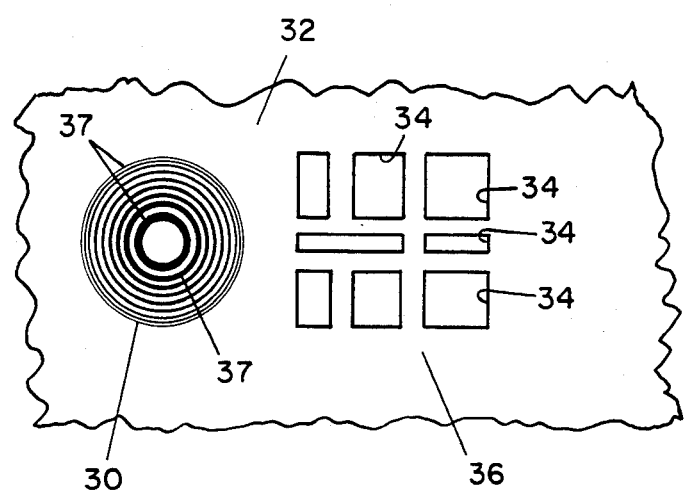
FIG. 2 is a plan view of patterned, photoresist coated substrate.
Figure 3:
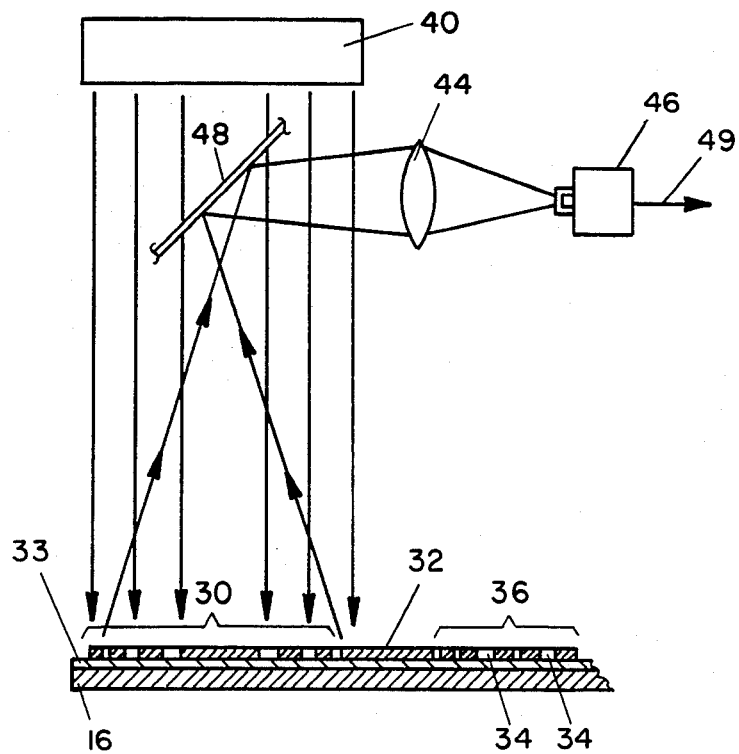
FIG. 3 is a schematic diagram of apparatus for detecting light reflected from a Fresnel zone plate.

Such accurate end point detection is accomplished by forming a Fresnel zone plate 30 (see FIGS. 2 and 3) in a photoresist coating 32 over an aluminum layer 33 in an area of the silicon wafer 16 proximate apertures 34—34 in the photoresist. The apertures 34—34 are located in areas 36 in which portions of circuit devices are to be fabricated.

The theory of the formation of Fresnel zone plates is well known and is described in detail in "The Fundamentals of Optics" by Jenkins and White, McGraw Hill Book Co., 1957, pages 353 et seq. which is incorporated by reference herein. A zone plate 30 has a plurality of concentric rings or zones 37—37 having a decreasing width from the inner to the outer zone. Alternate annular zones 37—37 are light absorbing while the remaining zones are light reflective.

In operation, the Fresnel zone plate 30 is illuminated by a beam of light from a laser 40 directed through a quartz glass viewing port 42 in the chamber 10 (see FIG. 1). The light reflected from the zone plate 30 is directed through focusing optics 44 and onto a photodetector 46 by a beamsplitter 48. The photodetector 46 converts the intensity of the light impinging thereon into an electrical output signal 49. The Fresnel zone plate 30 substantially enhances the intensity of the reflected light from that portion of the silicon wafer 16. Such enhancement of the reflected light precludes masking thereof by background light. As the exposed aluminum 33 is etched the thickness thereof is reduced. When the exposed portions of the aluminum layer 33 have been fully etched light from the laser 40 will impinge on the underlying P-glass (Phosphorus doped glass) layer (not shown) on silicon the silicon 16 which has less reflectivity to the particular frequency of laser light used. When this occurs the Fresnel zone plate 30 is substantially destroyed resulting in a rapid decrease in the intensity of the reflected light and the associated output signal 49.

Figure 4:
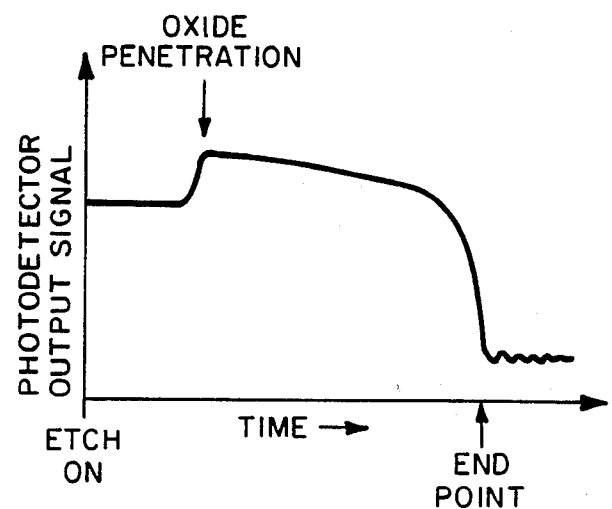
FIG. 4 shows a curve depicting the output signal of a photodetector.

FIG. 4 depicts the output signal 49 of the photodetector 46. When etching aluminum 33 an initial period is required to penetrate a thin oxide layer (not shown) on the surface of the aluminum layer 33. The reflectance of the oxide layer is high but less than that of the aluminum layer 33 therebelow. Once the oxide layer has been penetrated the amount of light reflected increases noticeably and remains high until the exposed portion of the aluminum layer 33 has been etched away causing the reflected light and the photodetector output signal 49 to decrease substantially due to the reduced reflectivity of the P-glass layer therebelow. The rapid decrease of the output signal 49 indicates the end point of the plasma etching process. The output signal 49 of the photodetector 46 can be processed to provide a signal to terminate the etching process when the output level falls to a predetermined value. Such processing can be done manually or automatically. Furthermore, the instant technique can be used to probe individual wafers 16—16 in a batch machine such as a HEX reactor, manufactured by Applied Materials Corporation, to determine the optimum time for the termination of the process. It can also be used to monitor non-uniformities on a single wafer by accessing zone plates 30—30 in different areas of a wafer in a single wafer etcher to achieve the optimum yield per wafer and wafer-to-wafer reproducibility.

The Fresnel zone plate 30 (see FIG. 2) in the photoresist layer 32 is comprised of dark zones 37—37 which represent the exposed aluminum 33 while the light zones 37—37 represent the photoresist material. One technique for forming the zone plate 30 is to print the concentric annular zones 37—37 of the Fresnel zone plate 30 and the device 36 patterns simultaneously in the photoresist 32 by incorporating the concentric ring pattern into the mask associated with the particular level. This can be done as the pattern is being written on the mask by an E-beam machine.

In an exemplary embodiment in which the photoresist 32 is about 1.5 micron thick the outer diameter of the zone plate 30 is 2.0 mm having 100 zones with the inner zone radius of approximately 100 microns. The Fresnel zones 37—37 are formed with radii proportional to the square roots of whole numbers which are the number of the zones from the inner (1) to the outer zone (100). The alternate zones 37—37 are formed of the photoresist 32 which absorb a substantial portion of the light while the remaining zones are formed of the highly reflective exposed aluminum. The preferred laser 40 is a continuous wave He-Cd having a wavelength of 325 nm which is substantially absorbed by the photoresist which is Microposit 2400 manufactured by the Shipley Company. The detected intensity of the light at the focus of the zone plate 30 having 50 zones 37—37 is at least 1000 times greater than the detected intensity of the light reflected from the plain aluminum surface 33.

As hereinbefore indicated the instant technique not only detects the plasma etching "end point" of a single layer of material but can detect a variation in the material composition during etching (e.g., between aluminum oxide and aluminum—see FIG. 4) due to a change of reflectivity. Advantageously, the etching parameters (e.g., etchants, power levels, pressure, etc.) can be adjusted during the etching process to account for the sudden change in the composition of the material being etched.

It is to be understood that the embodiments described herein are merely illustrative of the principles of the invention. Various modifications may be made thereto by persons skilled in the art which will embody the principles of the invention and fall within the spirit and scope thereof.

What is claimed is:

1. A method for detecting the end point of the etching of a pattern formed in a layer of material by etching through openings in an etch resistant coating on the surface of the material, the method comprising the steps of:

simultaneously etching: (1) the material, through the openings, and (2) a Fresnel zone plate, located proximate the pattern, comprised of a plurality of annular zones which are alternately formed of the etch resistant material and the exposed material to be etched;

monitoring light reflected from the Fresnel zone plate during etching; and terminating the etch process when the intensity of light reflected from the Fresnel zone plate falls below a predetermined level.

2. The method as set forth in claim 1, wherein the light monitoring step comprises:

directing a beam of light towards the Fresnel zone plate; and detecting the intensity of the light reflected from the plate.

3. The method as set forth in claim 1, wherein:

the etch resistant material is photoresist that has a low reflectivity to the light while the material to be etched is highly reflective to the light.

4. The method as set forth in claim 1, wherein: etching is accomplished by plasma etching.

5. The method as set forth in claim 1, wherein:

etching is accomplished by chemical etching.

6. The method as set forth in claim 3, wherein:
the layer of material is aluminum which coats a P-glass layer over a semiconductor substrate, the P-glass having a low reflectivity to light.

7. The method as set forth in claim 1, wherein the layer of material is comprised of a plurality of different layers, each having a different reflectivity, the method comprising:
adjusting the parameters of the etching process for each layer as it is being etched based upon the intensity of the light detected.

8. The method as set forth in claim 7, wherein:
etching is accomplished by plasma etching.

9. The method as set forth in claim 7, wherein:
etching is accomplished by chemical etching.

10. The method as set forth in claim 7, wherein:
the layer of material covers a P-glass layer over a semiconductor substrate, the P-glass having low reflectivity; and
the layer of material is comprised of an aluminum layer having an aluminum oxide coating layer thereon.

11. A method for detecting the end point of the etching of a pattern in an aluminum layer that coats a P-glass layer on a semiconductor substrate, the pattern being etched through openings in a photoresist coating on the aluminum layer, comprising the steps of:
simultaneously plasma etching: (1) the pattern, and (2) a Fresnel zone plate comprised of a plurality of annular zones which are alternately formed of the photoresist and exposed portions of the aluminum layer;
monitoring light reflected from the Fresnel zone plate during plasma etching; and
terminating the plasma etching process when the intensity of the light reflected from the Fresnel zone plate falls below a predetermined level.

12. The method as set forth in claim 11, wherein the light monitoring step comprises the steps of:
directing a beam of light towards the Fresnel zone plate; and
detecting the intensity of the light reflected from the plate.

13. The method as set forth in claim 12, wherein the aluminum layer has an oxide coating layer thereon which has a different reflectivity than the aluminum layer, the method comprising:
adjusting the parameters of the etching process for each layer as it is being etched based upon the intensity of the light detected.

14. The method as set forth in claim 11, wherein:
the semiconductor substrate is a silicon wafer.

* * * * *